United States Patent [19] [11] 4,309,811

Calhoun [45] Jan. 12, 1982

[54] MEANS AND METHOD OF REDUCING THE NUMBER OF MASKS UTILIZED IN FABRICATING COMPLEX MULTILEVEL INTEGRATED CIRCUITS

[75] Inventor: Donald F. Calhoun, Torrance, Calif.

[73] Assignee: Hughes Aircraft Company, Culver City, Calif.

[21] Appl. No.: 383,020

[22] Filed: Jul. 26, 1973

Related U.S. Application Data

[60] Continuation of Ser. No. 211,701, Dec. 23, 1971, abandoned, which is a division of Ser. No. 16,868, Mar. 5, 1970, abandoned.

[51] Int. Cl.³ .................... H01L 21/16; H01L 21/283
[52] U.S. Cl. ................................. 29/574; 29/577 C; 29/578
[58] Field of Search ............. 317/101 A; 29/574, 577; 156/11, 17

[56] References Cited

U.S. PATENT DOCUMENTS

| | | | |
|---|---|---|---|
| 3,423,822 | 1/1969 | Davidson et al. | 317/101 A |
| 3,434,020 | 3/1969 | Ruggiero | 317/101 A |
| 3,498,833 | 3/1970 | Lehrer | 156/17 |
| 3,518,751 | 7/1970 | Waters et al. | 29/577 |
| 3,615,466 | 10/1971 | Sahni | 29/577 |
| 3,618,201 | 11/1971 | Makimoto et al. | 29/574 |
| 3,627,598 | 12/1971 | McDonald | 156/11 |

FOREIGN PATENT DOCUMENTS 1117579 6/1968 United Kingdom ................ 317/101

Primary Examiner—David Smith, Jr.
Attorney, Agent, or Firm—Lewis B. Sternfels; W. H. MacAllister

[57] ABSTRACT

A plurality of integrated circuit wafers each having a plurality of cells disposed in a rectilinear array with the yield distribution of usable cells varying from wafer to wafer but in which there is a common yield distribution of at least Y usable cells or portions thereof in corresponding locations on N wafers (where Y and N are integers); a layer of electrical insulation that exposes the pads of the Y common yield distribution usuable circuits to a second level of metalization which is formed into conductors by a first pad relocation mask which is common to the N wafers for effectively routing the exposed pads of the Y usable cells to master pattern circuit locations; and a layer of electrical insulation formed over the second level of metalization having master pattern vias formed therethrough which expose the pads at master pattern cell locations to a top layer of metalization formed into a common or master pattern of interconnects which interconnect the cells into the specific circuit type by a master pattern mask common to the Y wafers and a plurality of other wafers to be connected into the specific circuit type.

13 Claims, 7 Drawing Figures

MEANS AND METHOD OF REDUCING THE NUMBER OF MASKS UTILIZED IN FABRICATING COMPLEX MULTILEVEL INTEGRATED CIRCUITS

CROSS-REFERENCE TO RELATED APPLICATIONS

This is a continuation of application Ser. No. 211,701 filed Dec. 23, 1971, now abandoned, which, in turn, is a division of application Ser. No. 16,868 filed Mar. 5, 1970, now abandoned.

BACKGROUND OF THE INVENTION

1. Field of the Invention

This invention relates generally to fabrication of multi-level complex integrated circuits and relates more particularly to means and methods of fabricating a plurality of integrated circuit wafers having imperfect cell yields by utilizing the same common masks for fabricating the alternate layers of dielectric insulation and layers of metalization thereon.

2. Description of the Prior Art

In integrated circuit technology wafers having a non-uniform yield of good cells have heretofore been interconnected into functional circuit types by producing a plurality of masks tailored for that particular wafer yield distribution, each mask being associated with an individual alternate layer of dielectric insulation or metalization formed in laminae on the wafer. A first one of these masks was utilized during fabrication to define and form feedthroughs or vias in a first layer of insulation exposing the pads of selected good cells at the first layer of metalization on the surface of the wafer. A second mask was utilized to form a second layer of metalization into electrical conductors associated with the vias in the first layer of insulation and cross-unders all routed to the location of vias which were subsequently formed in a second layer of insulation by a third mask. At least one (possibly more) alternate layer of metalization was formed on top of the second layer of insulation and fabricated into interconnect lines and cross-overs as defined by a fourth mask whereupon all of the selected good cells were electrically interconnected into a functionally specified complex integrated circuit.

Thus, it can be seen that this technique required that the multiple masks for each wafer had to be tailored to or laid out for a particular wafer since the yield distribution of usable cells varied from wafer to wafer.

SUMMARY OF THE INVENTION

Objects, features, and advantages of this invention can be attained with the provision of a plurality of integrated circuit wafers each having a unique yield distribution of usable cells with at least a portion Y of the usable cells being at cell locations common to N of the plurality of wafers (where Y and N are integers). A layer of dielectric insulation is formed on top of the wafers which exposes the signal-connects associated with the common usable cells by means of vias formed with a first vias mask common to the yield distribution of the Y cells of the N wafers. A layer of metalization is in turn fabricated by a mask common to the yield distribution of the N wafers into a plurality of conductors which effectively route the signal-connects to predetermined circuit locations preferably at master pattern circuit locations. Thereafter, another layer of dielectric insulation is formed on top of the metalization with vias formed therethrough by means of a master pattern vpredetermined circuit locations to a top layer of metalization which is formed into electrical interconnects by a master pattern mask means having a master pattern conductor layout which is common to the N wafers and also common to signal-connects at the master pattern in a second layer of metalization of all wafers that are to be connected into a specific circuit type.

One advantage of this invention is that: the number and, therefore, the cost of unique metalization and dielectric insulation associated masks that must be generated in the production of multi-level complex integrated circuit arrays is reduced by a factor of N where N is the number of wafers that can use the same mask; thus, rather than generating 2N metalization masks and 2N insulation or via masks for N wafers, only two of each mask or four masks will suffice for the N wafers. In addition, the number and, therefore, the cost of separate times, a man and/or a computer must determine the sufficient means of routing a number Y of cells into a complex integrated circuit by means of alternate layers of insulation and metalization, is reduced by a factor of N. This is because N wafer arrays can be processed from each set of masks. Still further, a certain amount of standardization and improved reliability can result from having the number of unique masks reduced by a factor of N whereupon a more thorough verification of the mask can be justified. Consequently, if a problem should exist, it could more easily be detected on the first completed part before committing the remaining N wafers to fabrication. In addition, if it is desired, more thorough work could be justified in the specification of the mask so as to better insure reliability and the resulting performance on the wafer.

BRIEF DESCRIPTION OF THE DRAWINGS

Other objectives, features and advantages of this invention will become apparent upon reading the following detailed description and referring to the accompanying drawings wherein.

DESCRIPTION OF A PREFERRED EMBODIMENT

Figure 1:
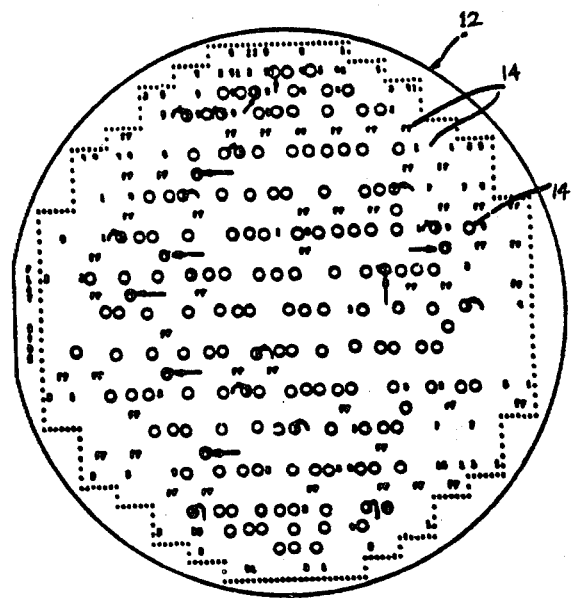
FIG. 1 is a schematic graphical illustration of one wafer of a number (N) of wafers, with numeric and letter symbols thereon indicating the actual location and yield distribution of Y usable cells which are common to the N wafers, with circles thereon indicating a master pattern of preferred circuit locations, and with directional lines indicating how selected usable cells are relocated to master pattern circuit locations as illustrated schematically by the lines having arrowheads.

Referring now to the drawings in more detail, FIG. 1 illustrates an integrated circuit wafer 12 having a predominantly circular periphery except for one portion thereof which is formed as a straight edge so that the integrated circuit wafer can be properly oriented. The integrated circuit wafer 12 is further divided into a plurality of individual integrated circuit cells which, although not specifically shown in FIG. 1, are generally rectangular and, for the embodiment illustrated, arranged in a rectilinear array in a manner known in the art. A number of the cells in FIG. 1 are identified by numeric and letter symbols 14 and generally in FIGS. 2a, 3a and 3b by indicium 14. Each one of these cells can, for example, be 0.060 inch by 0.060 inch and is electrically separated from the adjacent cells by a border of electrically isolating material. The cell itself can include a plurality of active circuit elements such as semi-conductor diodes and transistors and passive elements such as conductors, resistors, and capacitors. These elements are coupled together by metalization in the wafer 12 into a predetermined circuit configuration so that, when electrical signals are applied to signal connects of the cells, it will operate in a predetermined manner.

Figure 2A:
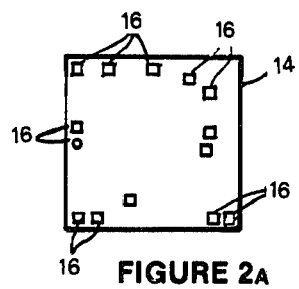
FIG. 2a is an enlarged top plan view schematically illustrating exemplary pad locations in the first layer of metalization of one of the integrated circuit cells such as represented by any of the numeric and letter symbols of FIG. 1.

In order to facilitate signal connections with the individual cells 14, each cell includes a plurality of signal connect members or pads 16 as shown in FIG. 2a located at termination ends of signal lines. These pads 16 usually have a somewhat larger dimension and area than the signal line widths which are associated with. For example, the pads 16 can have a dimension of 0.003 inch×0.003 inch whereas the associated conductor may only be 0.001 inch wide. There can, for example, be fourteen or possibly more or fewer of these pads 16 associated with each cell. The active and passive elements of each cell are usually arranged internally of the cell 14 so that electrical signals can be applied to some of the pads 16 whereupon a portion of the integrated circuit components can be used as a gate, flip-flop, or other circuit element; or else input or output lines can be coupled to all of the pads of a cell so that that cell operates as a complete logic circuit. Hereinafter, when the term "cell" is used, it should be understood that this is intended to cover both the entire cell or any functional portion thereof. Furthermore, in those instances where the term "usable cells" is used, it is intended to be synonymous with the term "good cells" or any portion thereof.

The yield of usable cells to total cells on the wafer 12 has heretofore been less than 100%. For example, the yield typically can be between 20% and 80% and possibly more. With such yield there is no discernible pattern to the specific locations of usable cells 14 and unusable cells 14 since they are located unpredictably across the array even though there is a tendency for good cells 14 to be predominantly located toward the center of the wafer 12. Even with such a random distribution of the usable cells, there is a probability that, if N of the wafers are tested, a common yield distribution of Y usable cells will be determined on the N wafers. In other words, if the N wafers were superposed, Y of the usable cells would be in registry or superposed over each other on all N wafers. The number of wafers N so tested would vary with the percentage yield and the value of Y.

In order to determine which of the cells 14 is usable or good, they are generally tested electrically so that the good cells can be determined and properly identified. Generally a d.c. electrical test is made of each circuit to obtain adequate identification of the good circuit. In addition, further a.c. electrical testing of the good cells can be performed for added confidence in the operational capabilities of the circuit.

After electrical testing of the cells 14 has been completed, it is usually determined that the lack of common usable cells on N wafers occur in an unpredictable pattern, as exemplified and identified by the symbols "1", "3", "5", "7", and "FF" located above some of the rectangular integrated circuit cells 14 of FIG. 1.

In this particular example: the numeric symbol "1" is representative of at least one defective one input NAND gate in the corresponding cell of the N wafers; the numeric symbol "3" is representative of a defective three input NAND gate; the numeric symbol "5" is representative of a defective five input NAND gate; the numeric symbol "7" is representative of a defective seven input NAND gate; and the letter symbol "FF" is representative of a defective flip-flop. Those cells, that are not labelled with one of the above identified symbols located therein, are representative of a common good or usable cell 14 on all N wafers, e.g., as illustrated by one indicium 14 leading to an otherwise unidentified blank space between a pair of defective cells both identified by "1" and by another indicium 14 leading to an "O" having none of the above numeric or letter symbols therein.

A master pattern of cell locations selected for a five bit sign and magnitude modular multiplier, fabricated from an exemplary integrated circuit slice part, is represented in FIG. 1 by means of one or more of a plurality of geometric symbols such as a circle "O".

Where actual common good cells 14 exist in general registry with or coincidence with a master pattern circuit location, they are identified by the specific geometric symbol "O" as exemplified above within one of the otherwise blank rectangular cells 14 not otherwise identified by a numeric or letter symbol. When, however, a master pattern cell location does not contain or coexist with a common good cell, as represented by the specific geometric symbol "O" and one of the symbols "1", "3", "5", "7" or "FF" within the same cell, it is necessary to relocate the pads 16 of a selected nearby usable cell 14 to pad locations at a master pattern circuit or cell location in a manner to be described in more detail subsequently with reference to FIG. 4. By thus effectively relocating the pads of Y common cells to master pattern cell locations for any one of the wafers, they can similarly be relocated for the remaining ones of the N wafers. Consequently, the pad relocation technique for one wafer will be described in detail.

Generally, nearby good cells 14 can be relocated to a master pattern cell location in a second layer of metalization by interconnect lines or electrical conductors 20 each routed from an exposed pad 16 of the selected good cell to a corresponding pad location at the master pattern circuit location but isolated from the latter circuit by a dielectric film. Such routing of the pad relocation lines 20 is illustrated schematically in FIG. 1 by the straight line segments having arrowheads at one end and extending between a selected good cell location and a master pattern cell location. It should, of course, be understood that each one of the lines 20 with arrowheads in FIG. 1 is representative of a plurality of individual interconnect lines or conductors, each of which is routed from a pad of a good cell to a pad at the master pattern cell location as illustrated in more detail for individual pad relocation lines in FIG. 3. It should be understood that a master pattern cell or circuit location does not have to be congruent with or superposed on a wafer cell location.

As a result of the relocation of selected good cells 14 to the master pattern cell location where no good cell would otherwise be found, a common or master pattern of good cells is effectively established. This allows standard or master pattern masks of vias and interconnect lines to be used to form an additional top layer of master pattern interconnect lines for interconnecting the individual cells 14 together into a specific part type, as will be described in more detail with reference to FIG. 5.

Figure 2B:
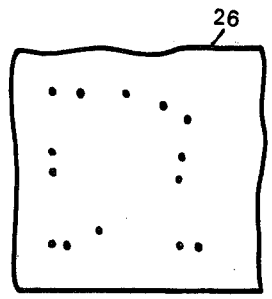
FIG. 2b is an enlarged schematic illustration of a portion of a mask of the type associated with the formation vias or feedthroughs in a layer of dielectric insulation over the cells represented in FIG. 1 exposing the pads of a selected integrated circuit cell.
Figure 3A:
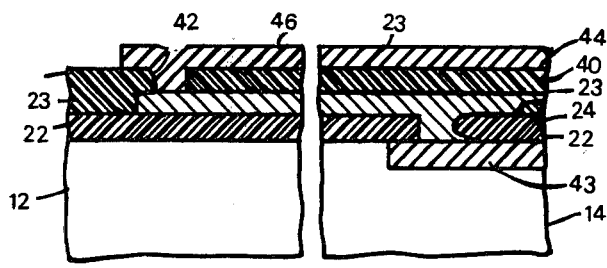
FIG. 3a is an enlarged cross-sectional side elevational view, not to scale, illustrating the relationship between the integrated circuit cell, vias in a first layer of dielectric insulation, pad relocation lines in a second layer of metalization, master pattern vias in a second layer insulation, and master pattern interconnect lines in a third layer of metalization.

Reference is now made to one such fabrication of a complex integrated circuit, specific processing details of which are described for several methods in my copending patent application entitled Integrated Circuit Interconnections by Pad Relocation, Ser. No. 206,555, filed Dec. 9, 1971, now U.S. Pat. No. 3,795,972 issued Mar. 12, 1974, a divisional application of Ser. No. 762,459, filed Sept. 25, 1968, now abandoned. As illustrated in FIG. 3a, the first layer of metalization integral with the surface of the wafer 12 and containing the pads 16 (FIG. 2a) has a layer of dielectric insulation material 22, such as low sodium glass or quartz formed thereon, with vias 24 or feedthroughs processed therethrough in registration with the pads 16 of selected cell 14. These vias 24 are formed in the insulation 22 by a photoprocess, such as by utilizing a via mask 26 produced for that particular common yield distribution of Y usable cells on N wafers, a portion of which is shown in FIG. 2b. This via mask 26 selectively exposes a layer of photoresist so that a portion of the photoresist remains over the selected pads 16 while the layer of insulation 22 is formed. When the photoresist is subsequently removed, vias 24 are formed through the insulation 22 which expose the pads 16.

It should be understood that the entire mask 26 for vias 24 has not been illustrated in detail in FIG. 2b since the scale on patent drawings is too small to adequately illustrate a vias aperture having an actual dimension of 0.001 inch. However, the specific location of vias 24 in the first layer of electric insulation 22 can be identified and determined by referring to FIGS. 4 and 5 wherein the vias 24 are located at the termination ends of individual conductors in the second layer of metalization that are not coincident with another terminating end of conductors in the other layer of metalization or coincident with a feedunder in the second layer of metalization when the two metalization layers of interconnects are superposed over one another.

For purposes of illustration, the enlarged cross sectional view, not to scale, in FIG. 3a schematically illustrates a via 24 extending from a pad 16 in the first layer of metalization on the face of an integrated circuit cell 14 to the second layer of metalization 28 such as, for example, aluminum which contains the pad relocation lines 20. While a cross-sectional view of the partially fabricated or integrated wafer which is metalized to its third layer of metalization is shown in FIG. 3a (as well as FIG. 3b), the full second layer of metalization in plan or face view, looking from above and only at metalization layer 28 (thus omitting insulation 40 and third layer of metalization 44), is illustrated generally in FIG. 4. As previously mentioned with reference to FIG. 1, these pad relocation lines 20 are each routed from pads 16 of selected usable cells to a master pattern circuit location. These master pattern circuit or cell locations include not only areas congruent to and superposed over wafer cells 14 but also include areas above the wafer not in registry with or superposed over any one cell or bounded by any cell. For example, such master pattern locations can be the relocated signal connect ends or pads of the pad relocation conductors 20. Although these pad relocation lines are typically straight line segments 0.003 inch wide on 0.004 inch centers extending parallel to rectilinear coordinates, it would be possible to use other configurations and routing. The signal connect portions of the pad relocation conductors 20 are generally dimensioned at least as wide as a pad or can be formed into enlarged area pads (FIG. 4) or can be made narrower.

Figure 3B:
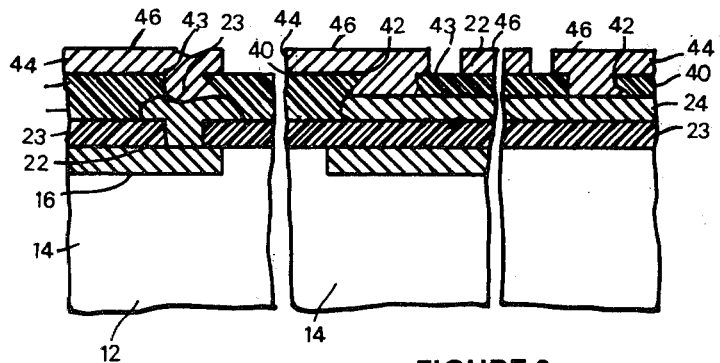
FIG. 3b is an enlarged cross-sectional side elevational view, not to scale, illustrating the relationship of the layers of dielectric insulation and vias between the pads of a usable integrated circuit cell and the master pattern interconnect line in a third layer of metalization, and in addition illustrates the relationship between master pattern vias in the second layer of insulation and cross-numbers in the second layer of metalization.

Furthermore, as illustrated in FIG. 3b, where a good cell, such as cell 14', coexists at a master pattern circuit location, the particular via 24' formed through the first layer of electrical insulation 22 merely exposes the pad, i.e., pad 16', of that good cell without necessarily requiring further routing of pad relocation lines 20' such as illustrated in FIG. 3a.

In addition to the pad relocation lines 20, the second layer of metalization 28 includes a plurality of crossunder conductor segments 32 located at reserved locations on the face of the first layer of insulation 22. As will be explained in more detail subsequently, some of these crossunders 32 can cooperate with the standard pattern of interconnect lines in the third layer of metalization, illustrated in full plan view in FIG. 5. As a result, all usable signal connect or logic lines must be brought to a top layer of metalization.

It should also be understood that these individual crossunder conductors 32 and pad relocation lines 20 are also formed in the second layer of metalization 28 by a photo process utilizing photoresist material and etching techniques, as described in more detail in my above referenced copending patent application. One technique is to expose the photoresist with a mask having conductors of the type illustrated in FIG. 4 tailored to the common yield distribution of Y usable cells on the N wafers wherein the master pattern circuit locations are common to a number of wafers greater than N. For example, the master pattern circuit locations can be common to all wafers in which the Y cells are to be interconnected into a specific functional circuit type.

A second layer of dielectric insulation 40, such as for example, low sodium glass or quartz, is formed on top of the second layer of metalization 28 with fixed position or master pattern vias 42 formed at master pattern circuit locations by a master pattern mask common to any number of wafers which have usable cells at master pattern circuit locations and which are to be fabricated into a specific part type. Thus, the same mask layout is not limited to use with only N wafers but can be used with a number of wafers far greater than N. A portion of these vias 42 expose the terminating ends, signal connect portions, or pads, of pad relocation lines 20 in the second layer of metalization 28 as illustrated in FIG. 3a. In addition, some of the vias, such as via 42', are superposed over the vias, specifically, via 24', in the first layer of electrical insulation 22, as illustrated in FIG. 3b, so that the pads 16' of the good cell in registry with the master pattern cell location are exposed to the top layer or third layer of metalization 44. In addition, some vias 42 are formed between terminating ends of standard pattern conductors 46 and the selected crossunder conductor segments 32. It should be noted that the crossunders 32 are not otherwise connected with the pads in the first layer of metalization or with pad relocation lines 20 in the second layer of metalization. Thus, as previously stated, all signal lines are brought to the top layer of metalization 44.

Figure 4:
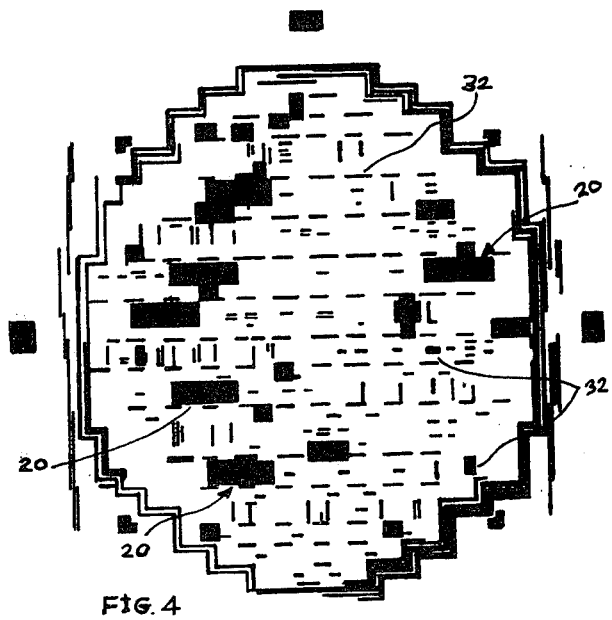
FIG. 4 is a top plan view of the second layer of metalization, a portion of which is shown in FIGS. 3a and 3b placed on a wafer, such as illustrated in FIG. 1, illustrating pad relocation lines and cross-under conductor line segments formed therein.
Figure 5:
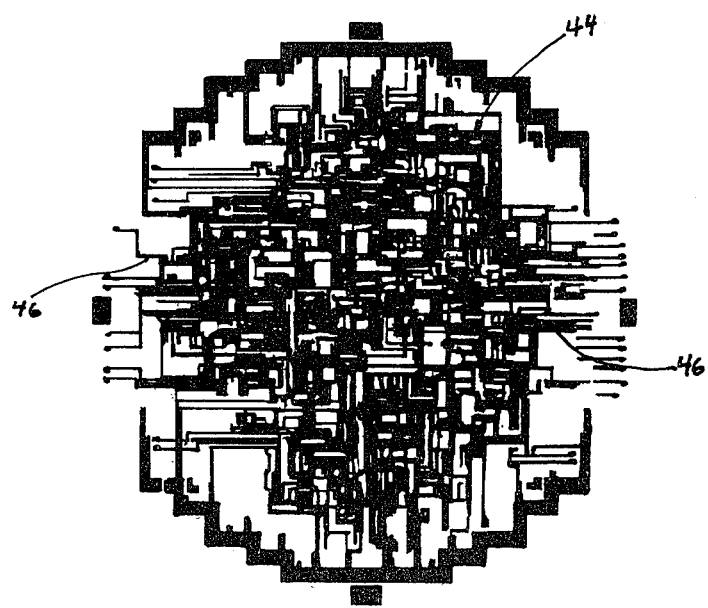
FIG. 5 is a top plan view of the third layer of the metalization, a portion of which is shown in FIGS. 3a and 3b and placed on a wafer, such as illustrated in FIG. 1, illustrating the master pattern of interconnect lines which are selectively connected to the exposed pads of usable integrated circuit cells at master circuit locations, and to cross-unders in the second layer of the metalization through the master pattern vias.

Thereafter, the top layer or third layer of metalization 44 such as, for example, aluminum, is formed on top of the second layer of dielectrical insulation 40 with the terminating ends or portions of the fixed or master pattern of interconnect lines 46 illustrated in FIG. 5 in registry with the vias 42 in the second layer of insulation 40. In a manner similar to the representation shown in FIG. 4, FIG. 5 illustrates the full third level of metalization in plan or face view, looking from above and at the top of the cross-sectional partial view of the integrated wafer of FIG. 3a and 3b. As a result, the individual master pattern of cells, as relocated, are interconnected into a specified functional circuit which, when electrical signals are applied to the signal input thereof, will operate in a predetermined manner to produce output signals of predetermined characteristics at its output terminals. It should be understood that the standard pattern conductors or interconnect 46 in the top layer of metalization 44 are also formed with a master pattern mask common to any number of wafers having usable cells of master pattern cell locations and which are to be interconnected into a specific function part type circuit, by means of the photoresist technique in combination with etching techniques. Thus, that master pattern mask is not limited to use with only the N wafers but can be used with any number of wafers.

While salient features have been illustrated and described with respect to a particular embodiment, it should be readily apparent that modifications can be made within the spirit and scope of the invention.

What is claimed is:

1. An integrated circuit interconnection method for interconnecting operable circuits into an electrical function on each of a plurality of integrated circuit wafers, each of the wafers capable of performing the same electrical function and having a plurality of operable and inoperable circuits occurring in random positions, each of the circuits having primary signal-connect means associated therewith in a first level of metalization, comprising the steps of:

predetermining desired identical positions of operable circuits at a level subsequent to the first level of metalization on all of the wafers irrespective of the actual random positions of the operable circuits on individual ones of the wafers;

testing the circuits of each of the wafers at the primary signal-connect means for determining the actual positions of the operable circuits;

comparing all of the tested wafers for determining the coincidence of a plurality of actual positions of operable circuits;

selecting at least one group of the compared wafers having the coinciding actual positions of operable circuits which are sufficient in quantity for performing the electrical function;

based upon said comparing and selecting steps, preparing a mask having means therein for defining where the primary signal-connect means of the coinciding operable circuits are to be extended to secondary signal-connect means;

electrically coupling and routing the primary signal-connect means of each of the coinciding operable circuits of each of the selected wafers in the group in an identical manner therefor to sites of the secondary signal-connect means thereon by using the mask for thereby terminating each of the coinciding operable circuits of the selected wafers at the secondary signal-contact means; and electrically coupling and routing the secondary signal-connect means to signal-connect means in the subsequent level of metalization and at locations defined by the predetermined identical desired positions by utilizing masking means identical to all of the wafers, including the group thereof, for interconnecting the coinciding operable circuits of the group and the operable circuits of others of the wafers in such a manner as for enabling each of the wafers to perform the electrical function.

2. The method of claim 1 wherein both said coupling and routing steps further comprise the steps of:

electrically isolating each of the inoperable circuits and the unselected operable circuits of the group of the selected wafers;

exposing the primary signal-connect means of only the coinciding operable circuits in a manner identical to the group of the selected wafers by use of the mask; and routing electrical conduction means from the exposed primary signal-connect means to the predetermined identical desired positions in a manner identical to all of the wafers.

3. The method of claim 1 wherein said testing step includes the step of electrically testing all of the circuits in a representative sample of all of the circuit wafers for determining the statistical location of the coinciding operable circuits.

4. A method of making a multi-level complex integrated circuit from any one of a plurality of N wafers each having an imperfect yield of usable cells therein with a portion Y of the usable cells on all N wafers having a common yield distribution, the improvement comprising the steps of:

determining the common yield distribution of the usable Y cells of the N wafers for locating the Y usable cells having common locations on each of the N wafers;

based on said determining step, forming a first vias mask having means for defining the locations of vias of the Y common cells in the common yield distribution and for enabling subsequent exposure of signal-connects of the Y common yield cells;

forming a layer of first electrical insulation on the N wafers with means for defining vias through the first electrical insulation layer to and exposing the signal-connects of the Y cells by using the first vias mask;

based upon said determining step, forming a first electrical conductor mask common to the N wafers having means for defining the locations of electrical conductors to be routed from the signal-connects of the Y cells to signal-connect portions commonly located on the N wafers;

forming a layer of electrical conductors on and common to the N wafers by using the first electrical conductor mask for routing the exposed signal-connects of the Y common yield cells through the vias means to the commonly located signal-connect portions;

forming a second vias mask having means for defining locations of vias common to the N wafers at the corresponding locations of the commonly located signal-connect portions;

forming a layer of second electrical insulation on the N wafers with means for defining vias through the second electrical insulation layer by using the second vias mask for exposing the commonly located signal-connect portions;

forming a master pattern electrical interconnect mask for defining a pattern of electrical conductors to be routed in a pattern common to all N wafers and for connection to the commonly located signal-connect portions; and forming a layer of electrical interconnect means routed from the commonly located signal-connect portions through the vias means in the second electrical insulation layer by using the master pattern interconnect mask for interconnecting the Y cells of the N wafers into a functional circuit type.

5. An integrated circuit interconnection method for interconnecting a specified number of operable circuits into an electrical function on each of a plurality of integrated circuit wafers, each of the wafers capable of performing the same electrical function and having a plurality of operable and inoperable circuits occurring in random positions, each of the circuits having signal-connect means associated therewith, the specified number of operable circuits of each of the circuit wafers being at most equal to and included within a randomly distributed set of the operable circuits, and the set of the operable circuits coinciding in common positions with statistical probability on at least two of the circuit wafers, comprising the steps of:

testing the circuits of each of the wafers at the signal-connect means for determining the actual positions of all of the operable circuits;

comparing the actual positions of the operable circuits on the wafers for determining the set of the operable circuits whose actual positions coincide on a plurality of the wafers in the common positions;

selecting a plurality of the operable circuits from any of the randomly distributed set of the operable circuits sufficient in number for providing the electrical function and thereby for determining the specified number of the operable circuits on each of the plurality of the wafers;

based upon said testing, comparing and selecting steps, preparing masking means for defining routings from the specified number of the operable circuits to sites of subsequent signal-connect means; and electrically coupling, by utilizing the masking means, the signal-connect means of the specified number of the coinciding operable circuits on the plurality of the wafers in an identical manner therefor to the sites of the subsequent signal-contact means common for the plurality of the wafers for thereby terminating each of the specified number of the operable circuits at the subsequent signal-connect means.

6. The method of claim 5 further including the steps of:

selecting desired identical positions for the specified number of the operable circuits irrespective of the actual positions thereof on the plurality of the wafers; and conforming the masking means to the selected desired identical positions for interconnecting the subsequent signal-connect means of the plurality of the wafers from the specified number of the coinciding operable circuits into the electrical function.

7. The method of claiam 5 wherein said coupling step further comprises the steps of:

electrically isolating each of the inoperable circuits and the operable circuits not included within the specified numer of the coinciding operable circuits;

exposing the signal-connect means of at least the coinciding operable circuits of the specified number of the operable circuits in a manner identical to all of the plurality of the circuit wafers; and routing electrical conduction means from the exposed signal-connect means to the sites of the subsequent signal-connect means by utilizing the identical masking means in the manner identical to all of the plurality of the circuit wafers.

8. The method of claim 5 wherein said testing step includes the step of electrically testing all of the circuits in a representative sample of the circuit wafers for determining the statistical location of the set of the operable circuits.

9. A method for making a multilever complex integrated circuit from any one of a plurality of N wafers each having an imperfect yield of usable cells therein with a portion Y (where Y is an integer) of the usable cells on all N wafers having a common yield distribution, the improvement comprising the steps of:

determining the common yield distribution of the usable Y cells of the N wafers for locating the Y usable cells having common locations on each of the N wafers;

forming a first via mask based on the common yield distribution for subsequently exposing commonly located N wafer signal-connects of the Y common yield cells;

forming a first layer of electrical insulation with means for defining vias therein by using the first via mask for thereby exposing the commonly located signal-connects;

forming a first electrical conductor mask identical for the N wafers having means for defining routings of electrical conductors from the commonly located signal-connects through the vias means formed by the first via mask to sites of signal-connect portions at circuit locations common to the N wafers;

forming a layer of electrical conductors by using the first electrical conductor mask for routing the exposed signal-connects of the Y common yield cells to the sites of the common signal-connect portions and for forming the common signal-connect portions;

forming a second via mask identical for the N wafers having means therein for defining vias at the corresponding locations of the signal-connect portions of the circuit locations;

forming a second layer of electrical insulation having means for defining the vias corresponding to the vias defining means in the second via mask and for exposing the signal-connect portions;

forming an electrical interconnect mask identical to the N wafers having means for defining a pattern of electrical conductors routed across the N wafers in a pattern common to all the N wafers between selected vias in the second via mask; and forming a layer of electrical interconnect means routed from the vias means in the second layer of insulation by using the interconnect mask for interconnecting the Y cells into a functional circuit type common for the N wafers.

10. An integrated circuit interconnection method for interconnecting operable circuits into an electrical function on each of a plurality of integrated circuit wafers, each of the wafers capable of performing the same electrical function and having a plurality of operable and inoperable circuits occurring in random positions, each of the circuits having primary signal-connect means associated therewith in a given level of metalization, the operable circuits of each of the circuit wafers forming sets of operable circuits in which each of the sets comprises normally coinciding randomly distributed operable circuits in common positions with statistical probability on at least some of the circuit wafers, comprising the steps of:

predetermining desired identical positions of operable circuits;

testing the circuits of each of the wafers at the given level of metalization for determining the actual random positions of the operable cicuits;

selecting groups of the wafers whose actual random positions of the operable circuits normally coincide in at least two of the sets, and with the normally coinciding operable circuits in each of the groups of the wafers at least sufficient in quantity for later connecting of the normally coinciding operable circuits of all the groups to each of the desired positions corresponding to the predetermined desired identical positions;

based upon said predetermining, testing and selecting steps, preparing means for defining respective masks for each of the groups having means therein for defining routings from the primary signal-connect means of the normally coinciding operable circuits of each of the groups to sites of secondary signal-connect means common to all of the groups at the predetermined desired identical positions of the operable circuits;

by using the means for defining the respective masks, electrically coupling and routing the primary signal-connect means of a number, at least equal to the sufficient quantity, of the coinciding operable circuits in an identical manner for each of the groups of the wafers to the sites of the common secondary signal-connect means for thereby terminating the number of the coinciding operable circuits of each of the groups at the secondary signal-connect means in the predetermined desired identical positions; and further identical processing of each of the plurality of wafers of all the groups from the secondary signal-connect means of each of the wafers by using masking means identical to all of the wafers for interconnecting the number of the coinciding operable circuits thereof into the electrical function for enabling each of the wafers to perform the electrical function.

11. For use with a plurality of circuit wafers, each of the wafers having a plurality of operable and inoperable circuits in random positions, each of the circuits having primary signal-connect means associated therewith, a method for effecting identically positioned locations of secondary signal-connect means of operable circuits to be selected from any of the operable circuits irrespective of the position and distribution thereof on individual ones of the wafers, comprising the steps of:

locating a number of the operable circuits whose positions are identically positioned in a group of the wafers;

preparing a mask having means therein for defining where feedthrough means are to be extended to the primary signal-connect means of any of the identically positioned operable circuits as determined by said locating step;

forming an insulation layer over the circuits and over the primary signal-connect means;

forming feedthrough means in the insulation layer identical to the group of the wafers by use of the mask for defining openings to the primary signal-connect means of the identically positioned operable circuits; and electrically coupling, in a manner identical to the group of the circuit wafers, the primary signal-connect means of the identically positioned operable circuits through the feedthrough means to the secondry signal-connect means corresponding to the identical locations.

12. A method as in claim 11 further including the step of utilizing a first standard pattern of the identical locations varying in accordance with the statistically expected density and positions of the selected operable circuits and conforming the location of the actually located circuits to the pattern to the extent that the first standard pattern coincides with the location.

13. A method for conforming a specified number of operable devices into a desired function on each of a plurality of arrays, each of the arrays capable of performing the same desired function and having a plurality of operable and inoperable devices occurring in random positions, each of the devices having coupling means associated therewith, the specified number of operable devices of each of the arrays being at most equal to and included within a set of the operable devices and coinciding in common positions with statistical probability randomly distributed on at least two of the arrays, comprising the steps of:

testing the devices of each of the arrays at the coupling means for determining the actual positions of all of the operable devices;

comparing the actual positions of the operable devices of the arrays for determining the set and the specified number of the operable devices whose actual positions coincide in the common positions;

selecting at least two of the arrays having coinciding actual positions of operable devices for further processing;

preparing means for enabling conforming of the selected arrays into the desired function in an identical manner based upon and after the determination of the coinciding actual positions by said comparing step; and conforming the coupling means of the specified number of the coinciding operable devices of the selected arrays into the desired function in the identical manner by utilizing the identical selection means for each of the selected arrays.

* * * * *